United States Patent Office 3,378,735

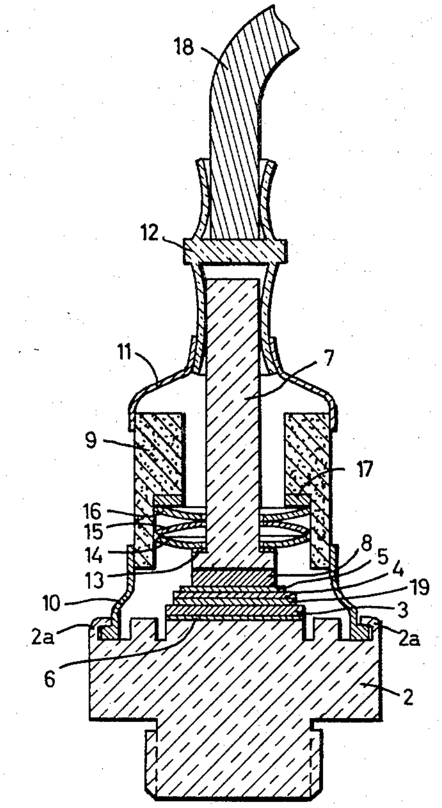
18
12
11
7
9
17
16
15
14
13
8
5
4
19
10
3
2a
2a
6
2

Patented Apr. 16, 1968

3,378,735

SEMICONDUCTOR DEVICE HOUSING WITH SPRING CONTACT MEANS AND IMPROVED THERMAL CHARACTERISTICS

Reimer Emeis, Ebermannstadt, Germany, assignor to Siemens Aktiengesellschaft, Munich, Germany, a corporation of Germany Filed June 9, 1964, Ser. No. 373,689

Claims priority, application Germany, June 12, 1963, S 85,642

10 Claims. (Cl. 317—234)

ABSTRACT OF THE DISCLOSURE

A housing for an encapsulated semiconductor device has a copper base portion with a planar upper surface. The housing includes an upper portion, a lower portion affixed to the base portion and an intermediate portion of sintered aluminum oxide of high tensile and compression strength joining the upper and lower portions. The intermediate portion is of cylindrical configuration having a lip formed therein. A spring is positioned in abutment with the lip of the intermediate portion and with a semiconductor device on the planar upper surface of the copper base portion and maintains a pressure of 100 to 500 kg./cm.$^2$.

The present invention relates to an encapsulated electronic semiconductor device. More particularly, the invention relates to an encapsulated electronic semiconductor device such as a rectifier diode, power rectifier, transistor, or other device of the junction type.

The semiconductor device of the present invention is an improvement over the encapsulated electronic semiconductor device of my patent application Ser. No. 209,047, filed July 11, 1962, and issued Oct. 18, 1966 as U.S. Patent No. 3,280,384. The semiconductor device of my copending patent application comprises a disc-shaped essentially monocrystalline semiconductor body joined in large-area connection with at least one metal carrier plate which preferably consists of molybdenum. The semiconductor device also includes a cooling body which is connected to the carrier plate of the semiconductor and is utilized to dissipate the operational heat. The installation of the semiconductor body with alloyed electrodes and the alloyed carrier plate is held between the cooling body and a second metallic body at an area pressure between 100 and 500 kg./cm.$^2$ by means of spring pressure. The cooling body and the metallic body are designed to conduct electrical current.

The design of a semiconductor device of this type requires a large number of individual parts which encapsulate and house the semiconductor device. The semiconductor device of the present invention is of particularly compact structure due to a new and improved housing.

In accordance with the present invention, the semiconductor device comprises a holding structure which presses against an upper metal plate of the semiconductor device and constitutes a part of the housing wall. The holding structure is preferably of ceramic material of high tensile and compression strength. The holding structure preferably comprises sintered aluminum oxide. An additional advantage of the semiconductor device of the present invention is that it is particularly easy to assemble.

In order that the present invention may be readily carried into effect, it will now be described with reference to the accompanying drawing, wherein the single figure is a sectional side view of an embodiment of the encapsulated electronic semiconductor device of the present invention.

In the figure, a base 2 preferably comprises copper and serves as a cooling body or block. The block 2 may be equipped with a threaded portion, extending from its lower surface, through which it may be threadedly engaged with an additional cooling device. A semiconductor device which may comprise a rectifier, is placed upon the base 2. The semiconductor device consists of a molybdenum plate 3, a silicon plate 4 and an upper alloy electrode 5. A lower alloy electrode alloys the silicon plate 4 with the molybdenum plate 3.

It is advantageous to specially treat the lower contact surface of the molybdenum plate 3 and the contact surface of the base 2, for example, by lapping, according to the disclosure of my patent application Ser. No. 182,748, issued Oct. 18, 1966 as U.S. Patent No. 3,280,383. Lapping creates an even contact surface and assures good heat and current transfer.

It is preferable to insert silver foil 6 between the molybdenum plate 3 and the base 2. The silver foil 6 may, for example, be of 100 to 200 microns thickness and is preferably provided with a patterned surface, such as, for example, a waffle embossment similar to the knurling of a knurled knob. The embossment may be impressed by rolling. The silver foil 6 may also be planarly shaped by rolling, annealing and subsequent etching. The etching may be accomplished, for example, with nitric acid. This produces a fine etching pattern on the surface which is also particularly suitable for current and heat transfer.

It is preferable to treat or finish the pressure contact surfaces in such a manner that at least one of them is evenly knurled. That is, the etching depth of the surface should be between 0.5 and 50 microns; preferably between 1 and 3 microns. Also, each of two contact surfaces should be sufficiently planar so that departures of the centered surfaces from a geometrical plane is not greater than the etching depth, as described, for example, in my patent application Ser. No. 220,336, issued Oct. 18, 1966 as U.S. Patent No. 3,280,385.

A plunger portion, comprising a copper pin 7 and a small molybdenum plate 8, is placed upon the surface of the upper contact electrode 5. The upper contact electrode 5 may consist, for example, of a gold-silver eutectic or a gold-silicon eutectic. The small molybdenum plate 8 may be, for example, 2 to 3 mm. thick and may be joined to the copper pin 7 by hard soldering. The contact surfaces, through which the molybdenum plate 8 and the upper contact electrode 5 abut are preferably lapped to planar shape to assume good heat and current transfer.

A substantially bell-shaped housing portion 9, 10, 11 is placed over the entire semiconductor device and serves to encapsulate or house said semiconductor device. The center or intermediate portion comprises a substantially cylindrical ceramic material 9 to which a lower metallic part 10 and an upper metallic part 11 are affixed, such as by soldering. Prior to soldering, the ceramic part 9 may be metallized in known manner at the appropriate places.

The upper metal part 11 is joined, such as by hard soldering, to an additional metal part 12 having a substantially H-shaped cross-section. The metal part 12 may consist, for example, of copper, the metal part 11 may comprise for example an iron-nickel-cobalt alloy, and the metal part 10 may also consist of an iron-nickel-cobalt alloy. The ceramic part 9 preferably comprises a sintered aluminum oxide, possessing adequately high tensile and compression strength to support the pressure of the pressure contact connection.

The copper pin 7 preferably has a small bottom portion of greater diameter than that of the remainder of the pin. The bottom portion thus projects radially beyond the surface of the rest of the pin and forms a flange or collar coaxial with, but of greater radius than that of the remainder of the pin 7. The bottom flange portion of the copper pin 7 serves to support on its upper surface a washer 13 and three spring discs 14, 15 and 16. The washer 13 may be of steel. The lower surface of the bottom flange portion of the copper pin 7 is joined to the molybdenum plate 8.

The central portion 9 of the housing is of substantially cylindrical configuration and is preferably coaxially positioned around the copper pin 7. The central portion 9 has a substantially constant outer diameter and has two different inner diameters. The inner diameter of the upper part of the central portion 9 is smaller than that of the lower part thereof so that the upper part is closer to the pin 7 than the lower part and forms a lip or collar at its juncture with said lower part which serves to support a ring 17 consisting of ductile material, such as, for example, silver or steel, which may be affixed to or inserted into the ceramic central portion 9. The spring 16 abuts and presses against the ring 17.

A cable 18 is inserted into the upper opening of the H-shaped part 12 and is connected to said part by the said part being compresed or squeezed around the said cable. The pin 7 is also connected to the part 12, subsequent to the assembling process, by said part being compressed or squeezed around said pin.

The lower part 10 is connected to the base 2 by flanging, whereby a rim or edge 2$a$ on the upper portion of said base is bent over a radially extending flange on the bottom of the lower part 10. The metallic part 10 may, of course, be joined with the base 2 by any suitable means, such as, for example, welding or hard soldering.

The entire encapsulated electronic semiconductor device of the present invention is preferably of axially symmetrical design. Axial symmetry considerably facilitates the assembly of the device.

I claim:

1. An encapsulated semiconductor device, comprising a housing having a base portion of electrically and heat conducting material having a substantially planar upper surface, said housing comprising an upper portion, a lower portion affixed to said base portion and an intermediate portion of ceramic material of high tensile and compression strength joining said upper portion to said lower portion;

a first metal plate supported on the planar upper surface of the base portion of said housing;

a substantially monocrystalline semiconductor plate having integral electrode means, said semiconductor plate being supported on said first metal plate;

a second metal plate supported on said semiconductor plate, said semiconductor plate being positioned between said first and second metal plates in face to face area contact with both of the said first and second metal plates; and spring means positioned between the intermediate portion of said housing and said second metal plate and abutting against said intermediate portion for maintaining said first and second metal plates and said semiconductor plate in contact under a pressure of 100 to 500 kg./cm.$^2$.

2. An encapsulated semiconductor device, comprising a housing having a base portion of electrically and heat conducting material having a substantially planar upper surface, said housing comprising an upper portion, a lower portion affixed to said base portion and an intermediate portion of ceramic material of high tensile and compression strength joining said upper portion to said lower portion, said intermediate portion having a lip formed therein;

a first metal plate supported on the planar upper surface of the base portion of said housing;

a substantially monocrystalline semiconductor plate having integral electrode means, said semiconductor plate being supported on said first metal plate;

a second metal plate supported on said semiconductor plate, said semiconductor plate being positioned between said first and second metal plates in face to face area contact with both of the said first and second metal plates; and spring means positioned between the intermediate portion of said housing and said second metal plate and abutting against the lip of said intermediate portion for maintaining said first and second metal plates and said semiconductor plate in contact under a pressure of 100 to 500 kg./cm.$^2$.

3. An encapsulated semiconductor device, comprising a housing having a base portion of electrically and heat conducting material having a substantially planar upper surface, said housing comprising an upper portion, a lower portion affixed to said base portion and an intermediate portion joining said upper portion to said lower portion, said intermediate portion being of ceramic material in substantially cylindrical configuration and having a substantially constant outer diameter, a lower part having a determined inner diameter and an upper part having an inner diameter smaller than the inner diameter of said lower part so that said upper part forms a lip at its juncture with said lower part;

a first metal plate supported on the planar upper surface of the base portion of said housing;

a substantially monocrystalline semiconductor plate having integral electrode means, said semiconductor plate being supported on said first metal plate;

a second metal plate supported on said semiconductor plate, said semiconductor plate being positioned between said first and second metal plates in face to face area contact with both of the said first and second metal plates; and spring means positioned between the intermediate portion of said housing and said second metal plate and abutting against the lip of said intermediate portion for maintaining said first and second metal plates and said semi-conductor plate in contact.

4. An encapsulated semiconductor device, comprising a housing having a base portion of electrically and heat conducting material having a substantially planar upper surface, said housing comprising an upper portion, a lower portion affixed to said base portion and an intermediate portion of sintered aluminum oxide of high tensile and compression strength joining said upper portion to said lower portion;

a layer of silver on the planar upper surface of the base portion of said housing;

a first metal plate supported on said silver layer;

a substantially monocrystalline semiconductor plate having integral electrode means, said semiconductor plate being supported on said first metal plate;

a second metal plate supported on said semiconductor plate, said semiconductor plate being positioned between said first and second metal plates in face to face area contact with both of the said first and second metal plates; and spring means positioned between the intermediate portion of said housing and said second metal plate and abutting against said intermediate portion for maintaining said first and second metal plates, said semiconductor plate and said silver layer in contact under a pressure of 100 to 500 kg./cm.$^2$.

5. An encapsulated semiconductor device, comprising a housing having a base portion of electrically and heat conducting material having a substantially planar upper surface, said housing comprising an upper portion, a lower portion affixed to said base portion and an intermediate portion of sintered aluminum oxide of high tensile and compression strength joining said upper portion to said lower portion, said intermediate portion having a lip formed therein;
a layer of silver on the planar upper surface of the base portion of said housing;
a first metal plate supported on said silver layer;
a substantially monocrystalline semiconductor plate having integral electrode means, said semiconductor plate being supported on said first metal plate;
a second metal plate supported on said semiconductor plate, said semiconductor plate being positioned between said first and second metal plates in face to face area contact with both of the said first and second metal plates; and
spring means positioned between the intermediate portion of said housing and said second metal plate and abutting against the lip of said intermediate portion for maintaining said first and second metal plates, said semiconductor plate and said silver layer in contact under a pressure of 100 to 500 kg./cm.².

6. An encapsulated semiconductor device, comprising
a housing having a base portion of electrically and heat conducting material having a substantially planar upper surface, said housing comprising an upper portion, a lower portion affixed to said base portion and an intermediate portion of sintered aluminum oxide of high tensile and compression strength joining said upper portion to said lower portion, said intermediate portion being of substantially cylindrical configuration and having a lower part having a determined inner diameter and an upper part having an inner diameter smaller than the inner diameter of said lower part so that said upper part forms a lip at its juncture with said lower part;
a layer of silver on the planar upper surface of the base portion of said housing;
a first metal plate supported on said silver layer;
a substantially monocrystalline semiconductor plate having integral electrode means, said semiconductor plate being supported on said first metal plate;
a second metal plate supported on said semiconductor plate, said semiconductor plate being positioned between said first and second metal plates in face to face area contact with both of the said first and second metal plates; and
spring means positioned between the intermediate portion of said housing and said second metal plate and abutting against the lip of said intermediate portion for maintaining said first and second metal plates, said semiconductor plate and said silver layer in contact under a pressure of 100 to 500 kg./cm.².

7. An encapsulated semiconductor device, comprising
a housing having a base portion of electrically and heat conducting material having a substantially planar upper surface, said housing comprising an upper portion, a lower portion affixed to said base portion and an intermediate portion of sintered aluminum oxide of high tensile and compression strength joining said upper portion to said lower portion, said intermediate portion being of substantially cylindrical configuration and having a substantially constant outer diameter, a lower part having a determined inner diameter and an upper part having an inner diameter smaller than the inner diameter of said lower part so that said upper part forms a lip at its juncture with said lower part;
a layer of silver on the planar upper surface of the base portion of said housing;
a first metal plate supported on said silver layer;
a substantially monocrystalline semiconductor plate having integral electrode means, said semiconductor plate being supported on said first metal plate;
a second metal plate supported on said semiconductor plate, said semiconductor plate being positioned between said first and second metal plates in face to face area contact with both of the said first and second metal plates; and
spring means positioned between the intermediate portion of said housing and said second metal plate and abutting against the lip of said intermediate portion for maintaining said first and second metal plates, said semiconductor plate and said silver layer in contact under a pressure of 100 to 500 kg./cm.².

8. An encapsulated semiconductor device, comprising
a housing having a copper base portion having a substantially planar upper surface, said housing comprising an upper portion, a lower portion affixed to said base portion and an intermediate portion of sintered aluminum oxide of high tensile and compression strength joining said upper portion to said lower portion;
a layer of silver on the planar upper surface of the base portion of said housing;
a first molybdenum plate supported on said silver layer;
a substantially monocrystalline semiconductor plate of disc configuration having integral electrode means, said semiconductor plate being supported on said first molybdenum plate;
a second molybdenum plate supported on said semiconductor plate, said semiconductor plate being positioned between said first and second molybdenum plates in face to face area contact with both of the said first and second molybdenum plates; and
spring means positioned between the intermediate portion of said housing and said second molybdenum plate and abutting against said intermediate portion for maintaining said first and second molybdenum plates, said semiconductor plate and said silver layer in contact under a pressure of 100 to 500 kg./cm.².

9. An encapsulated semiconductor device, comprising
a housing having a copper base portion having a substantially planar upper surface, said housing comprising an upper portion, a lower portion affixed to said base portion and an intermediate portion of sintered aluminum oxide of high tensile and compression strength joining said upper portion to said lower portion, said intermediate portion having a lip formed therein;
a layer of silver on the planar upper surface of the base portion of said housing;
a first molybdenum plate supported on said silver layer;
a substantially monocrystalline semiconductor plate of disc configuration having integral electrode means, said semiconductor plate being supported on said first molybdenum plate;
a second molybdenum plate supported on said semiconductor plate, said semiconductor plate being positioned between said first and second molybdenum plates in face to face area contact with both of the said first and second molybdenum plates; and
spring means positioned between the intermediate portion of said housing and said second molybdenum plate and abutting against the lip of said intermediate portion for maintaining said first and second molybdenum plates, said semiconductor plate and said silver layer in contact under a pressure of 100 to 500 kg./cm.².

10. An encapsulated semiconductor device, comprising
a housing having a copper base portion having a substantially planar upper surface, said housing comprising an upper portion, a lower portion affixed to said base portion and an intermediate portion of sintered aluminum oxide of high tensile and compression strength joining said upper portion to said lower portion, said intermediate portion being of substantially cylindrical configuration and having a substantially constant outer diameter, a lower part having a determined inner diameter and an upper part having an inner diameter smaller than the inner diameter of said lower part so that said upper part forms a lip at its juncture with said lower part;

a layer of silver on the planar upper surface of the base portion of said housing;

a first molybdenum plate supported on said silver layer;

a substantially monocrystalline semiconductor plate of disc configuration having integral electrode means, said semiconductor plate being supported on said first molybdenum plate;

a second molybdenum plate supported on said semiconductor plate, said semiconductor plate being positioned between said first and second molybdenum plates in face to face area contact with both of the said first and second molybdenum plates; and spring means positioned between the intermediate portion of said housing and said second molybdenum plate and abutting against the lip of said intermediate portion for maintaining said first and second molybdenum plates, said semiconductor plate and said silver layer in contact under a pressure of 100 to 500 kg./cm.$^2$.

References Cited

UNITED STATES PATENTS

| | | | |
|---|---|---|---|
| 3,170,098 | 2/1965 | Marino | 317—234 |
| 3,192,454 | 6/1965 | Rosenheinrich et al. | 317—234 |
| 3,252,060 | 5/1966 | Marino et al. | 317—234 |
| 3,280,383 | 10/1966 | Emeis | 317—234 |
| 3,280,384 | 10/1966 | Emeis | 317—234 |
| 3,280,387 | 10/1966 | Emeis | 317—234 |
| 3,293,509 | 12/1966 | Emeis | 317—234 |
| 3,293,510 | 12/1966 | Pfaffenberger et al. | 317—235 |
| 3,299,328 | 1/1967 | Martin et al. | 317—234 |

JOHN W. HUCKERT, *Primary Examiner.*

R. F. SANDLER, *Assistant Examiner.*